(12) United States Patent
Corbo et al.

(10) Patent No.: US 10,334,751 B2
(45) Date of Patent: Jun. 25, 2019

(54) ELECTRONICS RACK POST WITH INTEGRATED POWER AND DATA SUPPLY

(71) Applicant: Middle Atlantic Products, Inc., Fairfield, NJ (US)

(72) Inventors: Nico Corbo, Blairstown, NJ (US); John Franetovich, Glenwood, NJ (US)

(73) Assignee: Middle Atlantic Products, Inc., Fairfield, NJ (US)

( * ) Notice: Subject to any disclaimer, the term of this patent is extended or adjusted under 35 U.S.C. 154(b) by 0 days.

(21) Appl. No.: 15/994,505

(22) Filed: May 31, 2018

(65) Prior Publication Data
US 2018/0352675 A1 Dec. 6, 2018

Related U.S. Application Data

(60) Provisional application No. 62/515,782, filed on Jun. 6, 2017.

(51) Int. Cl.
*H01R 25/00* (2006.01)
*H05K 7/18* (2006.01)
(Continued)

(52) U.S. Cl.
CPC .............. *H05K 7/183* (2013.01); *H01R 13/70* (2013.01); *H01R 25/006* (2013.01); *H05K 7/1492* (2013.01); *H01R 13/518* (2013.01); *H01R 13/6395* (2013.01); *H01R 13/659* (2013.01); *H01R 25/14* (2013.01); *H01R 25/142* (2013.01); *H01R 25/145* (2013.01); *H01R 31/06* (2013.01)

(58) Field of Classification Search
CPC .............. H01R 13/518; H01R 13/659; H01R 13/6395; H01R 24/525; H01R 25/006; H01R 31/06; H01R 25/14; H01R 25/142; H01R 25/145

USPC .......... 439/540.01, 535, 120, 652, 207, 209, 439/214, 216, 540.1; 174/50, 520; 211/26, 20; 361/600, 796
See application file for complete search history.

(56) References Cited

U.S. PATENT DOCUMENTS 7,719,835 B1   5/2010  Schluter
8,622,756 B2 * 1/2014  Smed .................. H01R 9/2408
                                                   439/120

(Continued)

OTHER PUBLICATIONS

Next Generation MPR Series Modular Raceway System, Middle Atlantic Products, 96-01173/rev d/Jan. 16, 2017, 8 pages.

*Primary Examiner* — Abdullah A Riyami
*Assistant Examiner* — Justin M Kratt
(74) *Attorney, Agent, or Firm* — Drinker Biddle & Reath LLP

(57) ABSTRACT

An electronics rack for storing electronic components, the rack including a base frame, a top frame, and at least four vertical posts, each end of each vertical post attaching to the top frame and base frame and providing structural support for the rack. At least one of the vertical posts includes a post frame having two side walls and a back wall that are attached to one another to form a channel with an open front and an interior. At least one access panel is removably attached to the post frame so as to close off at least a portion of the open front of the channel, the access panel providing access to the interior of the channel. At least one of either a data connector assembly, an electrical outlet assembly, or a circuit breaker assembly is removably attached to the post frame.

10 Claims, 4 Drawing Sheets

(51) Int. Cl.
*H01R 13/70* (2006.01)
*H05K 7/14* (2006.01)
*H01R 13/659* (2011.01)
*H01R 13/639* (2006.01)
*H01R 31/06* (2006.01)
*H01R 25/14* (2006.01)
*H01R 13/518* (2006.01)

(56) References Cited

U.S. PATENT DOCUMENTS

| | | | |
|---|---|---|---|
| 8,882,536 B2 * | 11/2014 | Utz | H01R 43/26 |
| | | | 439/536 |
| 2009/0236909 A1 * | 9/2009 | Aldag | H01R 25/142 |
| | | | 307/39 |

* cited by examiner

ELECTRONICS RACK POST WITH INTEGRATED POWER AND DATA SUPPLY

RELATED APPLICATION

This application is related to and claims priority from U.S. Provisional Application 62/515,782, filed Jun. 6, 2017, the disclosure of which is incorporated herein in its entirety.

BACKGROUND

Racks for holding electronics, such as computer servers, processors, and storage banks are used in a variety of businesses and locations, including in data centers. Such racks are made from metal, such as steel, and designed to provide a strong, secure structure for containing and protecting the electronics from unauthorized access, inadvertent contact and adverse environmental conditions, while at the same time providing access for servicing.

Most frame assemblies include a top shelf, a base, and four or more vertical support rails that are screwed or attached to the into the top and base through the use of screws and multiple components. One improved, quick assembly rack is disclosed in US Patent Application Publication US2012/0292278, the disclosure of which is incorporated herein by reference in its entirety.

The power to the electronic components contained within the rack is generally provided by one or more power supplies or power distribution units (such as power strips) that are mounted within or on the outside of the rack. The power strips generally are vertically oriented and include a series of outlets. The electronic components in the rack are plugged into these PDUs or power strips thereby permitting movement or servicing of the rack or electronics component more convenient (i.e., to service the entire rack, the power strip can be unplugged, to service an individual component, that component can be unplugged.)

U.S. Pat. No. 7,719,835 discloses a wiring and power distribution device for use in a cabinet housing electronic equipment. The distribution device includes a plurality of compartments, with each compartment adapted to contain an electronic component, such as an uninterruptible power supply, a power-conditioning device, or a power distribution center containing circuit breakers. The distribution device provides a single input point for power and signal wiring, and at least one output point for connection to the electronic devices contained within the cabinet. Access to the compartments is provided by either removing the bottom panel and accessing through the top of the rack or removing knock-out plugs. The disclosure of U.S. Pat. No. 7,719,835 is incorporated herein by reference in its entirety.

While U.S. Pat. No. 7,719,835 provides an advance over prior power supplies, access to the components could be improved. A need, therefore, exists for an electronics rack that provides a more convenient power distribution system.

SUMMARY

An electronics rack for storing electronic components is disclosed. The rack includes a base frame, a top frame, and at least four vertical posts, each end of each vertical post attaching to the top frame and base frame and providing structural support for the rack. At least one of the vertical posts includes a post frame having two side walls and a back wall that are attached to one another to form a channel with an open front and an interior. At least one access panel is removably attached to the post frame so as to close off at least a portion of the open front of the channel, the access panel providing access to the interior of the channel. At least one of either a data connector assembly, an electrical outlet assembly, or a circuit breaker assembly is removably attached to the post frame.

Preferably the post frame is attached to the top and base frames so that the open front faces toward one of the adjacent posts. The post frame is preferably an extrusion with the side walls and back wall formed integral with one another.

There preferably are a plurality of access panels attached to the post frame along substantially the entire accessible length of the post, each access panel being separately removable from the post frame.

In an embodiment, one of the side walls has a lip that projects inwardly, and wherein the access panel has a first side edge that is slidably positioned under the lip, and a second side edge on the opposite side of the access panel from the first side edge that is attached to the post frame through a screw.

Preferably an upper end of the post includes a cable port that permits passage of electrical cabling or wiring into the interior of the channel, and has a removable plug to seal off the cable ports when not in use.

In an embodiment the data connector assembly includes one or more of an RJ45 and HDMI connector.

Preferably the outlet assembly includes at least two outlets and at least two circuit breakers.

In an embodiment there are multiple vertical posts each with a post frame having two side walls and a back wall that are attached to one another to form a channel with an open front and an interior, and each of the post frames is configured to provide a different form of data or power. Preferably one post frame includes one or more outlet assemblies and a second post frame includes one or more data connector assemblies.

The foregoing and other features of the invention and advantages of the present invention will become more apparent in light of the following detailed description of the preferred embodiments, as illustrated in the accompanying figures. As will be realized, the invention is capable of modifications in various respects, all without departing from the invention. Accordingly, the drawings and the description are to be regarded as illustrative in nature, and not as restrictive.

BRIEF DESCRIPTION OF THE DRAWINGS

For the purpose of illustrating the invention, the drawings show a form of the invention which is presently preferred. However, it should be understood that this invention is not limited to the precise arrangements and instrumentalities shown in the drawings.

DESCRIPTION OF THE PREFERRED EMBODIMENTS

Figure 1:
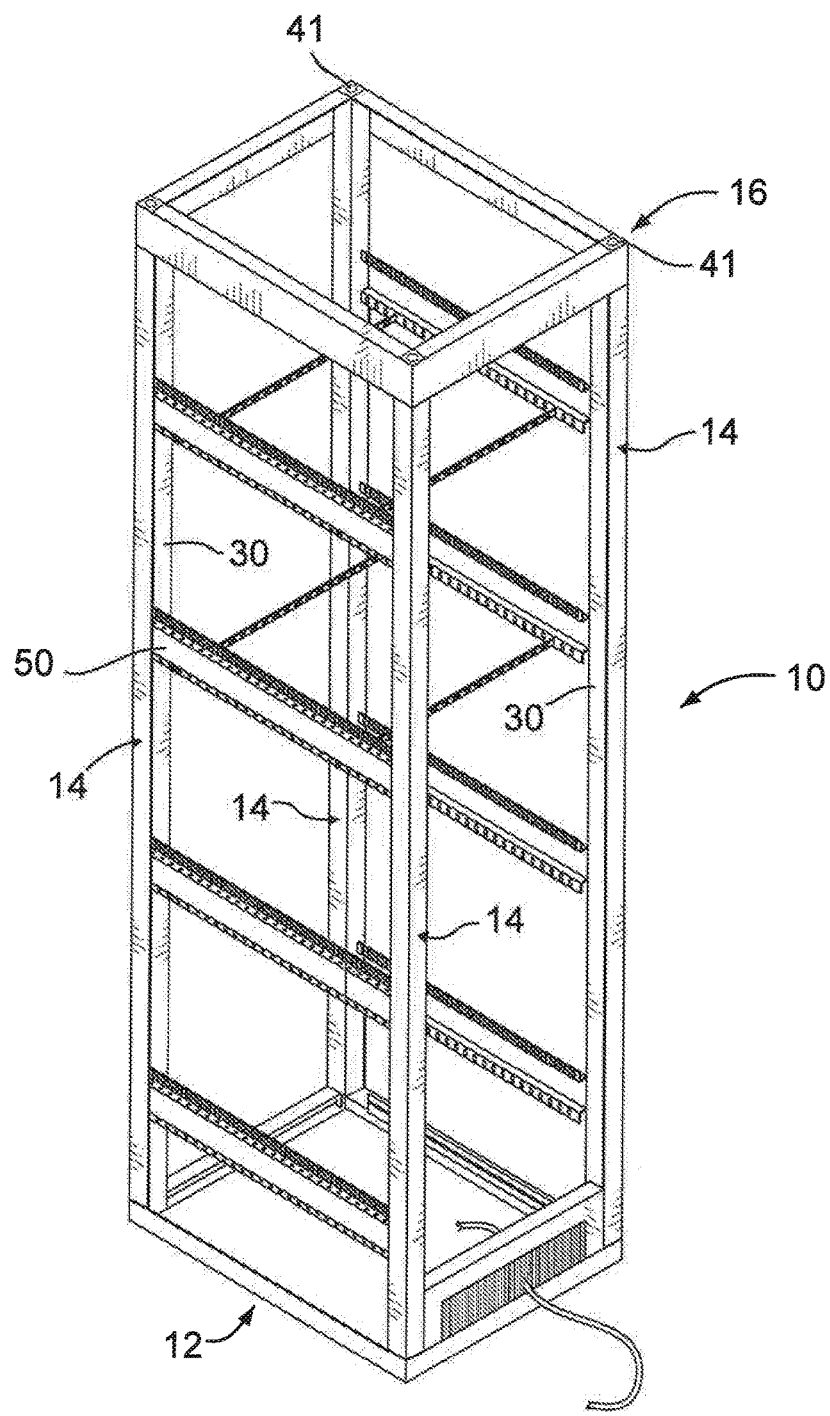
FIG. 1 is a perspective view of an electronics rack according to the present invention.

Referring to the figures, an electronics rack 10 is shown which is configured to store various electronics components, such as computer servers and audio/visual equipment. The rack 10 includes a base frame 12, at least four vertical posts or rails 14 and a top frame 16. Side panels 20 are attached to adjacent posts 14 to form an enclosure (See, FIG. 5). The front of the rack preferably includes an access panel, such as a door (not shown), that is removably or operably attached to the rack or a post so as to permit access to the interior of the rack. Each end of each vertical rails/posts 14 attaches to the top frame 16 and base frame 12 through a conventional means, such as screws, bolts or welds.

At least one of the posts 14, and more preferably a plurality of the posts 14, include a post frame 30 having two side walls 32 and a back wall 34 that are attached to one another to form a channel 36 with an open front 37. See, FIG. 3A. Other posts 14 in the rack 10 may be formed as conventional metal angles that do not include post frames as described herein. The post frame 30 is shown separated from the rack 10 in FIGS. 2A, 2B, 3A and 3B for ease of discussion. The open front 37 preferably faces into the interior of the rack so that the open front is accessible as will become more apparent herein. For example, if the posts 14 in the in the back of the rack 10 include a post frame 30, the open front 37 preferably faces toward the front of the rack 10. Similarly, if the posts 14 in the front of the rack 10 include the post frame, the open front 37 preferably faces toward the back of the rack 10 or the opposite side (i.e., the front left post frame 30 has its open front 37 facing toward the right side of the rack 10, and the front right post frame 30 has its open front facing toward the left side of the rack 10) thereby providing the service personnel with easy access. The post frame 30 is preferably formed as an extrusion with the side walls 32 and back wall 34 formed integral with one another. It is, however, also contemplated that the post frame 30 could be fabricated from sheet metal that is formed into the channel 36.

Figure 4A:
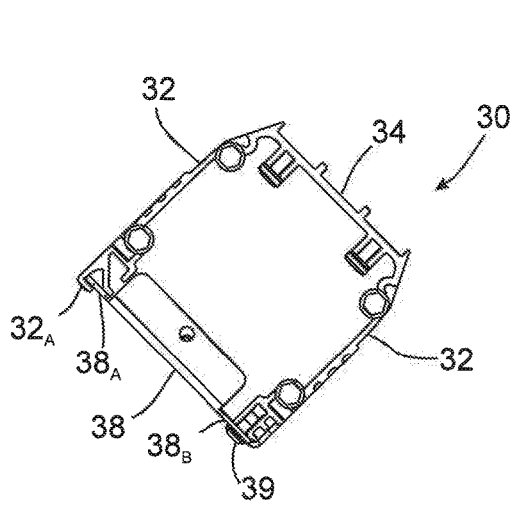
FIG. 4A is a cross-sectional view of the vertical post of FIG. 2A taken along lines 4A-4A in FIG. 2A.

The post frame 14 also includes at least one access panel 38 that is removably secured to the post frame 30 to close off at least a portion of the open front 37. More preferably, there are multiple panels 38 attached to the post frame 30 along substantially the entire accessible length of the post 14. See FIG. 2A. Each access panel 38 is separately removable from the post frame 30. The access panels 38 may be attached to the post frame 30 through any conventional means such as screws or snapped into engagement (e.g., include legs projecting inward that releasably engage with ends of the side walls 32.) One preferred method of attaching can be seen in FIG. 4A. One side wall 32 has a lip $32_A$ that projects inwardly. A side edge $38_A$ of the access panel 38 slides under the lip $32_A$. The opposite side edge $38_B$ of the access panel 38 is attached to the post frame through a screw 39.

The upper end 40 of the post 14 is attached to the top frame 16 so as to permit access to channel 36 through a cable port 41 in the upper end 40. Similarly, the lower end 42 of the post 14 is attached to the base frame 12 so as to permit access to channel 36 through a cable port (not shown but similar to cable port 41) in the lower end 42 of the post. The cable ports 41 permit cabling and/or wiring to pass into the channel 36 from the either end of the posts 14. Removable plugs 44 may be used to seal off the cable ports when not used for passage of cable.

Figure 2A:
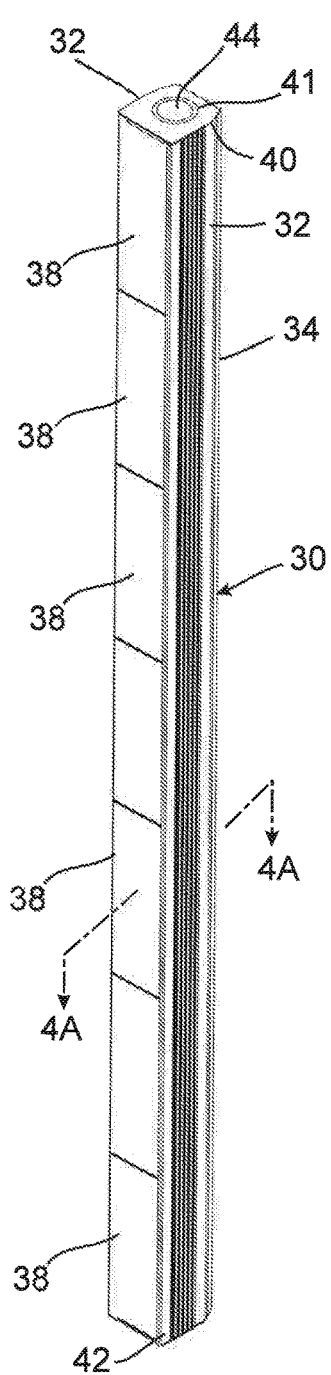
FIG. 2A is a perspective view of one vertical post of the electronics rack of FIG. 1.
Figure 2B:
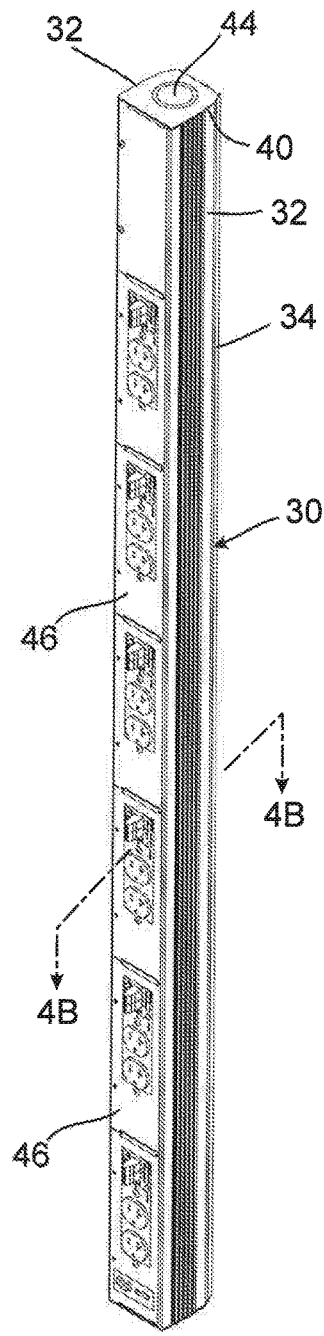
FIG. 2B is a perspective view of the vertical post of FIG. 2A with the access panels replaced with outlet assemblies.
Figure 3A:
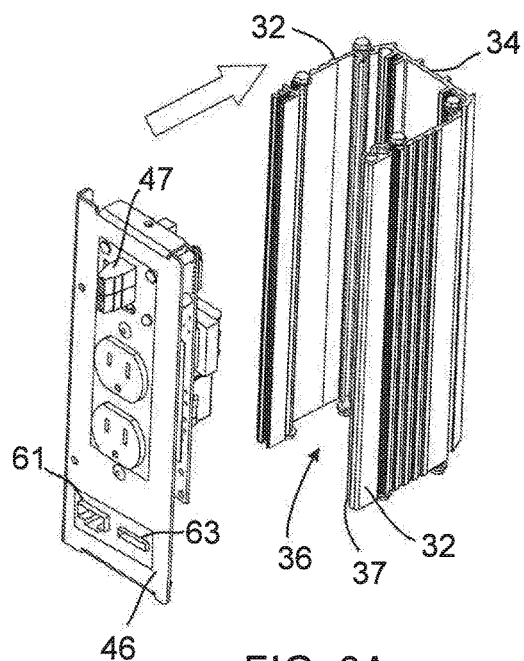
FIG. 3A is a perspective view of a portion of the vertical post of FIG. 2A with an outlet assembly shown separated from the frame.
Figure 3B:
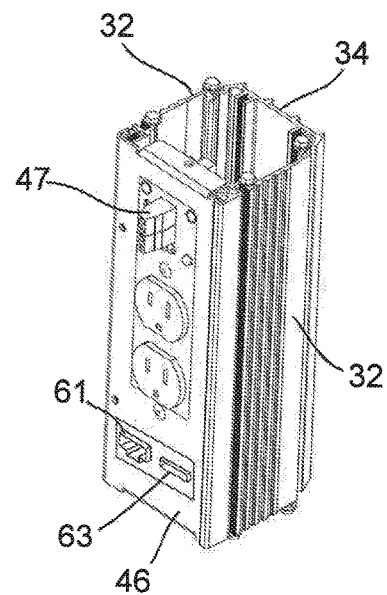
FIG. 3B is a perspective view of the vertical post portion of FIG. 3A with the outlet assembly attached to the frame.
Figure 4B:
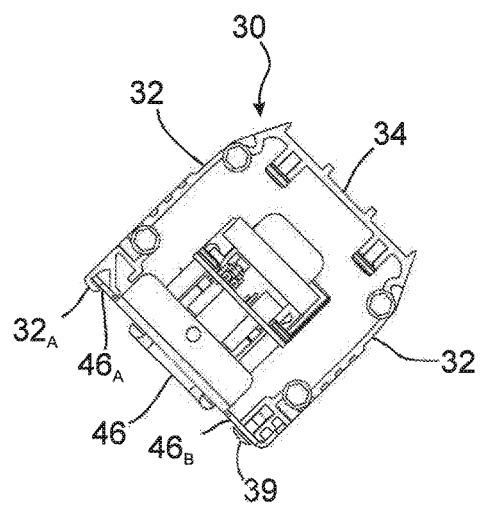
FIG. 4B is a cross-sectional view of the vertical post of FIG. 2B taken along lines 4B-4B in FIG. 2B.

As noted above, the access panels 38 are removable. This permits the post frames 30 to be configured or reconfigured to add one or more electrical communication assemblies, such as data connector assemblies, such as RJ45 and HDMI connectors 61, 63, electrical outlet assemblies, and/or circuit breaker assemblies, where needed. As shown in FIGS. 3A and 3B, the access panel 38 in the area of interest (e.g., adjacent to the location where an electronic component will be mounted in the rack) is removed from the post frame 30. A desired data connector assembly or outlet assembly 46 (with or without an integrated circuit breaker assembly 47) is selected and the wires connected to the appropriate wire/cables running through the channel 36. The data connector assembly or outlet assembly 46 is then secured to the frame 30 as shown in FIG. 3B. As shown in FIG. 4B, in a preferred attachment mechanism similar to the access panel 38, a side edge $46_A$ of the outlet assembly 46 slides under the lip $32_A$. The opposite side edge $46_B$ of the outlet assembly 46 is attached to the post frame 30 through a screw 39. FIG. 2B illustrates a plurality of outlet assemblies 46 attached to a post frame 30.

It is contemplated that each post frame 30 could provide different forms of data/power. For example, one post frame 30 could supply power, a second post frame 30 could supply back-up battery power, and a third post frame 30 could supply data. By utilizing the posts in the rack for channeling power/data from the top frame or base frame (where the power/data typically enters the rack), the present invention minimizes wiring runs in the interior of the enclosure and frees up internal space.

Figure 5:
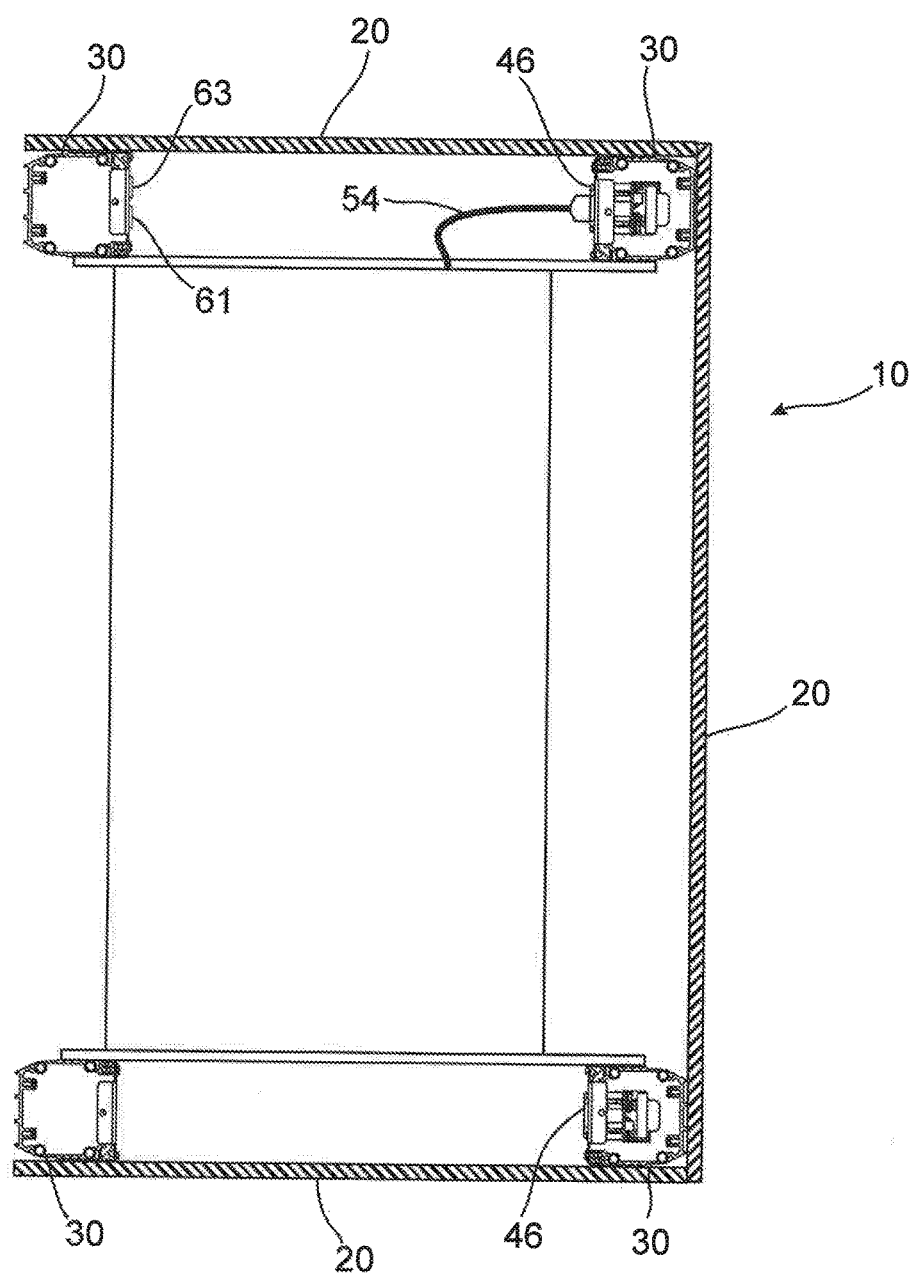
FIG. 5 a cross-sectional view of one embodiment of the rack with four vertical posts, each including a post frame.

FIG. 5 illustrates a cross-section of the rack with four post frames 30, one in each corner. Two of the post frames include outlet assemblies 46. The rack side panels 20 are shown attached to the post frames on three sides of the rack 10. Side rails 50 are shown extending between front and rear post frames 30. An electronics component 52, such as an server, is mounted to the rails 50 and electrically connected to an outlet through a wire 54.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed. The various embodiments and elements can be interchanged or combined in any suitable manner as necessary.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

The invention claimed is:

1. An electronics rack for storing electronic components, the rack comprising:
    a base frame;
    a top frame;
    at least four vertical posts, each end of each vertical post attaching to the top frame and base frame and providing structural support for the rack;
    wherein at least one of the vertical posts includes a post frame having two side walls and a back wall that are attached to one another to form a channel with an open front and an interior, and at least one access panel removably attached to the post frame so as to close off at least a portion of the open front of the channel, the removal of the access panel providing access to the interior of the channel, and
    at least one electrical communication assembly selected from a group consisting of a data connector assembly, an electrical outlet assembly, and a circuit breaker assembly is removably attached to the post frame.

2. The electronics rack of claim 1, wherein the post frame is attached to the top and base frames so that the open front faces toward one of the adjacent posts.

3. The electronics rack of claim 1, wherein the post frame is an extrusion with the side walls and back wall formed integral with one another.

4. The electronics rack of claim 1, wherein there are a plurality of access panels attached to the post frame along substantially the entire accessible length of the post, each access panel being separately removable from the post frame.

5. The electronics rack of claim 1, wherein one of the side walls has a lip that projects inwardly, and wherein the access panel has a first side edge that is slidably positioned under the lip, and a second side edge on the opposite side of the access panel from the first side edge that is attached to the post frame through a screw.

6. The electronics rack of claim 1, wherein an upper end of the post includes a cable port that permits passage of electrical cabling or wiring into the interior of the channel, the cable port having a removable plug to seal off the cable ports when not in use.

7. The electronics rack of claim 1, wherein the data connector assembly includes one or more of an RJ45 and HDMI connector.

8. The electronics rack of claim 1, wherein the outlet assembly includes at least two outlets and at least two circuit breakers.

9. The electronics rack of claim 1, wherein there are multiple vertical posts each with a post frame having two side walls and a back wall that are attached to one another to form a channel with an open front and an interior, and wherein each of the post frames is configured to provide a different form of data or power.

10. The electronics rack of claim 9, wherein one post frame includes one or more outlet assemblies and a second post frame includes one or more data connector assemblies.

* * * * *